(12) United States Patent
Wang et al.

(10) Patent No.: US 9,731,997 B2
(45) Date of Patent: Aug. 15, 2017

(54) MULTILAYER HEAT REJECTION COATING

(71) Applicant: Agency for Science, Technology and Research, Singapore (SG)

(72) Inventors: Shijie Wang, Singapore (SG); Lai Mun Wong, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/839,361

(22) Filed: Aug. 28, 2015

(65) Prior Publication Data

US 2016/0060751 A1    Mar. 3, 2016

(30) Foreign Application Priority Data

Aug. 29, 2014 (SG) .............................. 10201405350T

(51) Int. Cl.
| | |
|---|---|
| *C03C 17/36* | (2006.01) |
| *C23C 14/08* | (2006.01) |
| *C23C 14/14* | (2006.01) |

(52) U.S. Cl.
CPC .......... *C03C 17/3681* (2013.01); *C03C 17/36* (2013.01); *C03C 17/366* (2013.01);
(Continued)

(58) Field of Classification Search
CPC . C03C 17/36; C03C 17/3681; C03C 17/3657; C03C 17/3607; C03C 17/3613;
(Continued)

(56) References Cited

U.S. PATENT DOCUMENTS

| | | | | |
|---|---|---|---|---|
| 2008/0115471 | A1* | 5/2008 | Labrousse | C03C 17/23 55/385.3 |
| 2012/0219821 | A1* | 8/2012 | Frank | C03C 17/36 428/630 |
| 2013/0321905 | A1* | 12/2013 | Wang | G02B 5/208 359/360 |

FOREIGN PATENT DOCUMENTS

WO    WO-2005102953 A2    11/2005

OTHER PUBLICATIONS

Chaturverdi, et al. "A smooth optical superlens", Applied Physics letters, vol. 96, 2010, pp. 043102-1-043102-3.*

(Continued)

*Primary Examiner* — Jonathan Langman
(74) *Attorney, Agent, or Firm* — Schwegman Lundberg & Woessner, P.A.

(57) ABSTRACT

There is provided a multilayer coating comprising a plurality of layers comprising a) one or more layers of an elemental transition metal; b) one or more layers of an elemental metalloid; and c) two or more layers of an oxide; characterized in that the transition metal and metalloid layers are between the oxide layers and the plurality of layers does not need to contain an additional transparent conductive film (TCF). The multilayer coatings show high transparency in the visible light range combined with heat shielding without the need of transparent conductive oxide which have been previously used to achieve these properties. The multilayers can be produced with conventional physical vapor deposition methods on glass and polymer substrates. The coatings may therefore be used for applications on windows, plastic sheets and window shields. The invention relates also to the process for making the multilayer coatings, articles comprising them and their use in building and other applications.

10 Claims, 3 Drawing Sheets

(52) U.S. Cl.
CPC ...... *C03C 17/3607* (2013.01); *C03C 17/3613* (2013.01); *C03C 17/3642* (2013.01); *C03C 17/3644* (2013.01); *C03C 17/3649* (2013.01); *C03C 17/3657* (2013.01); *C23C 14/08* (2013.01); *C23C 14/14* (2013.01)

(58) Field of Classification Search
CPC ............ C03C 17/3642; C03C 17/3644; C03C 17/3649; C03C 17/366; C23C 14/08; C23C 14/14
See application file for complete search history.

(56) References Cited

OTHER PUBLICATIONS

Carrio et al., "Ultra-thin silver based infrared solar filter for ophthalmic lenses", presented 2011, http://upcommons.upc.edu/handle/2099.1/13877, internet retrieval date of Mar. 24, 2016.*

* cited by examiner

US 9,731,997 B2

MULTILAYER HEAT REJECTION COATING

CLAIM OF PRIORITY

This application claims the benefit of priority of Singapore Patent Application No. 10201405350T, filed on 29 Aug. 2014, the benefit of priority of which is claimed hereby, and which is incorporated by reference herein in its entirety.

TECHNICAL FIELD

The present invention generally relates to a multilayer coating as infrared light rejection material. The present invention also relates to an article comprising a multilayer coating on a substrate. The present invention further relates to the use of the article as windows or window shields.

BACKGROUND ART

Window films are sought for their heat rejecting property while allowing visible light to come in. Therefore, the clarity and the infrared rejection ability are two important considerations for window film applications. In order to reject most of the heat, existing technology uses metal/ITO multilayer stacks or tinted multilayer film technology. However, this reduces the transparency of window films for automobile and building applications. In a typical building, lighting and cooling occupies about 65% of the electricity cost. With the rising cost of cement and steel, coated glass with high natural lighting and high IR rejection property is an attractive alternative for a greener building. Such property is highly desirable in window coating applications used for building architecture and automobiles which can greatly reduce the transmission of heat from the exterior to enter the air-conditioned area. This keeps the interior of the buildings and automobiles cool and decreases the high dependency on air-conditioning, hence reduces the electricity used. In addition, with a good transparency in the visible range, natural light from the exterior can also enter which reduces the need of artificial lights during day time as compared to a highly tinted glass. Many conventional multilayer window films utilize transparent conductive oxide (TCO) layers. The problem of using TCO is that there are stability issues with the TCO when being used in conjunction with transition metal layers.

Furthermore, indium tin oxide (ITO), which comprises of about 90% $In_2O_3$ and about 10% $SnO_2$, has been the primary transparent conductive oxides (TCO) for display technology, photovoltaics and optoelectronics applications. However, due to limited indium supply, the price of indium has been increasing. Therefore, indium is a high cost raw material. Currently, most commercial multilayer structures use indium oxide or an ITO film. Alternative transparent conductive oxides such as doped zinc oxide are not easily optimized for producing a good quality film. There is therefore a need for coatings for glass that avoid the use of costly ITO and TCO.

For Silver-based multilayer coating, for example, there is a critical issue faced by the heat rejection coating industry which is the oxidation of the transition metal, especially Silver, which causes the degradation of the overall performance of these heat rejection coatings. There is therefore a need for multilayer coating, which avoids oxidation of the transition metal.

Further, damage to organic materials by UV light is a well-known issue. Common organic materials like plastics, polymers and wood will experience a rapid photolytic and photo-oxidative reaction, which will result in their photo-degradation.

Existing window films use a large number of layers. This means that the more layers they have, the more complicated their fabrication process will be. Some existing technologies utilize up to 100 layers.

There is therefore a need for a multilayer coating, which can be used to increase the heat rejection property of the film while maintaining high visible light transparency. There is also a need for a multilayer coating with a minimum amount of layers for ease of fabrication and materials cost. Further there is the need for a multilayer coating without using a TCO layer.

Accordingly, there is a need to provide a multilayer coating that overcomes, or at least ameliorates, one or more of the disadvantages described above.

SUMMARY OF INVENTION

In a first aspect, there is provided a multilayer coating comprising a plurality of layers comprising a) one or more layers of an elemental transition metal; b) one or more layers of an elemental metalloid; c) two or more layers of an oxide; characterized in that the transition metal and metalloid layers are between the oxide layers.

In one embodiment no additional transparent conductive film selected from conductive oxides (TCOs), conductive polymers and carbon nanotube (CNT), metal grating, graphene and nanowire thin films is needed.

Advantageously, the multilayer coating according to the invention shows desirable high infra-red (IR) rejection in the near infra-red (NIR) and short wavelength (SWIR) range while remaining transmission in the visible range. Furthermore the multilayer provides protection against UV rays from sun-light by being able to absorb the UV light. The coating can be applied at room temperature on various substrates, such as glass and plastic and shows good adhesion on the substrate surface even on flexible substrates. It further avoids the use of costly transparent conductive film materials.

Advantageously, the metalloid layer (for example Germanium) is introduced in between the transition metal to act as a diffusion barrier between transition metal layer and the oxide layer. In addition, this metalloid layer also promotes a better adhesion between oxide layer and transition metal layer and provides better crystallization formation of the transition metal layer (Silver). This improves the visible transparency and reliability of the overall multilayer coating.

In one embodiment, the oxide layer of the multilayer coating may exhibit no electrical conductivity.

In one embodiment, the oxide layer of the multilayer coating may be $SiO_2$. Advantageously, $SiO_2$ has good insulation properties. It is non-toxic, widely available and therefore in-expensive.

In one embodiment, the multilayer coating comprises a multilayer consisting of $SiO_2$/Germanium/Silver/Germanium/$SiO_2$. Advantageously, this multilayer can introduce the highly desirable properties in a preferred structure including infra-red rejection properties, transparency in the visible range and good insulation properties by the oxide.

All of these materials are non-toxic. Germanium is used in bio-magnetic bracelets. Silver is used in many wearable accessories for many years. Advantageously, the multilayer can therefore be part of articles with a use as disposable construction materials, automobile parts and consumer electronic devices where a selective transparency in the visible NIR region is required without any toxicological concerns.

In one embodiment, the multilayer coating consists of 5 to 6 layers. Advantageously, a small number of layers and the use of only three materials in these layers is sufficient to provide the required properties in optical and other properties, which facilitates production procedures and reduces production costs significantly, because other technologies require to introduce much more layers (7 to up to 100)

In a second aspect, there is provided an article comprising a) a substrate; and b) a multilayer coating as disclosed above in the form of a multilayer coating on a surface of said substrate. Advantageously, the properties of the film can then be introduced into this article without increasing its weight significantly. The multilayer coating can be a very thin film of less than about 200 to 300 nm.

In a third aspect, there is provided a process for making a multilayer coating as disclosed above, comprising depositing the layers using physical vapour deposition. Advantageously, this process can occur at room temperature. Therefore, no heating of the substrate may be required. This means less time is needed during deposition of the multilayer coating, because no temperature protocols or production including heating and cooling steps are needed. Moreover the process involves limited steps, because up to 5 or 6 layers are sufficient to achieve the heat rejection effect. The process of physical vapour deposition of the multilayer coating can cover a large area with good uniformity. Advantageously, mature commercial available technologies are available that can be used to achieve such high uniformity with high-throughput. The process is therefore compatible with a low cost, easy achievable production standard.

In a fourth aspect, there is provided for use of a multilayer as disclosed above for coating windows, windshields plastic sheets or building materials. Advantageously, the multilayer coating introduces its properties to the coated materials without any difficulty in manufacturing.

DEFINITIONS

The following words and terms used herein shall have the meaning indicated:

The term 'transparent conductive film' is to be interpreted to include films that are optically transparent and electrically conductive in thin layers. They are an important component of a number of electronic devices including Liquid-crystal displays, OLEDs, touchscreens and photovoltaics. While indium tin oxide (ITO) is the most widely used, alternatives include other transparent conductive oxides (TCOs), conductive polymers and carbon nanotube (CNT), metal grating, graphene and nanowire thin films.

The term 'substrate' is to be interpreted broadly to include materials upon which a plurality of layers may be deposited. The substrate may comprise any material, as long as it provides the required degree of transparency.

The term 'transition metal' is to be interpreted broadly to include any element in which the filling of the outermost shell to eight electrons within a periodic table is interrupted to bring the penultimate shell from 8 to 18 or 32 electrons. Transition elements may include, without limitation, Scandium, Titanium, Vanadium, Chromium, Manganese, Iron, Cobalt, Nickel, Copper, Zinc, Ytterbium, Zirconium, Niobium, Molybdenum, Silver, Lanthanum, Hafnium, Tantalum, Tungsten, Rhenium, rare-earth elements, Cerium, Praseodymium, Neodymium, Promethium, Samarium, Europium, Gadolinium, Terbium, Dysprosium, Holmium, Erbium, Thulium, Yttrium, Lutetium, and Rhodium.

The term 'toxic' is to be interpreted broadly to include acute and/or chronic toxicity. Acute 'toxicity' is understood as undesired adverse effects that occur immediately after exposure to a toxic substance. Usually the term acute refers to a short-term and high-dose exposure. Chronic 'toxicity' refers to undesired health effects that occur or persist after a long-term repeated exposure to a toxic substance (months or years). The toxicity may be human toxicity, or may be mammalian toxicity, or may be toxicity towards some other organism or group of organisms. The term 'non-toxic' shall be construed accordingly.

The term 'polymer' is to be interpreted broadly to include a chemical compound that comprises linked monomer units, and that may or may not be linear. Commonly a polymer will comprise at least 10 such monomer units per molecule. It may comprise from 10 to about 200 monomer units per molecule, or about 10 to 100, 10 to 50, 20 to 200, 20 to 100, 20 to 50 or 50 to 100 monomer units per molecule, e.g. about 10, 15, 20, 25, 30, 35, 40, 45, 50, 60, 70, 80, 90, 100, 110, 120, 130, 140, 150, 160, 170, 180, 190 or 200 monomer units per molecule. A polymer as used in the present application may have a narrow molecular weight distribution or a broad molecular weight distribution.

The term 'film' is to be interpreted broadly to include a thin, commonly flexible, form of a material, which may be for example a layer, or a plurality of layers, on a surface of a substrate.

The term 'inorganic matter' is to be interpreted broadly to include any matter which is substantially free of the element carbon.

The word "substantially" does not exclude "completely" e.g. a composition which is "substantially free" from Y may be completely free from Y. Where necessary, the word "substantially" may be omitted from the definition of the invention.

Unless specified otherwise, the terms "comprising" and "comprise", and grammatical variants thereof, are intended to represent "open" or "inclusive" language such that they include recited elements but also permit inclusion of additional, unrecited elements.

As used herein, the term "about", in the context of concentrations of components of the formulations, typically means +/−5% of the stated value, more typically +/−4% of the stated value, more typically +/−3% of the stated value, more typically, +/−2% of the stated value, even more typically +/−1% of the stated value, and even more typically +/−0.5% of the stated value.

Throughout this disclosure, certain embodiments may be disclosed in a range format. It should be understood that the description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Certain embodiments may also be described broadly and generically herein. Each of the narrower species and sub-generic groupings falling within the generic disclosure also form part of the disclosure. This includes the generic description of the embodiments with a proviso or negative limitation removing any subject matter from the genus, regardless of whether or not the excised material is specifically recited herein.

DETAILED DISCLOSURE OF EMBODIMENTS

Exemplary, non-limiting embodiments of a multilayer coating will now be disclosed.

There is provided a multilayer coating comprising a plurality of layers comprising a) one or more layers of an elemental transition metal; b) one or more layers of an elemental metalloid; c) two or more layers of an oxide; characterized in that the transition metal and the metalloid layers are between the oxide layers.

An additional transparent conductive film selected from conductive oxides (TCOs), conductive polymers and carbon nanotube (CNT), metal grating, graphene and nanowire thin films is not needed. Embodiments of the invention may therefore not contain additional transparent conductive films. The plurality of layers therefore may not contain an additional transparent conductive film selected from conductive oxides (TCOs), conductive polymers and carbon nanotube (CNT), metal grating, graphene and nanowire thin films.

This invention provides a multilayer coating which has the function of high tunable transparency in the visible region, high infra-red rejection, a UV filtering effect and an optional self-cleaning effect, but without having to use a transparent conductive film, such as a TCO layer.

The transition metal may be a group 10 element or may be a group 11 element or may be a group 12 element. Examples for group 10 elements include Nickel, Palladium and Platinum. Examples for group 11 elements include Copper, Silver and Gold. Examples for group 12 elements include Zinc and Cadmium. Preferably the transition metal has a capability of high infra-red or heat rejection when being deposited as a layer or film. The transition metal may be Silver. Silver may have the optimal heat rejection properties for the multilayer coating, at the additional advantage of being a relative low cost heat barrier and non-toxic.

The transition metal layer may have a thickness in the range of about 1 to 30 nm, or about 1 to 25 nm, or about 1 to 20 nm, or about 1 to 15 nm, or about 1 to 10 nm, or about 1 to 5 nm, or about 5 to 30 nm, or about 10 to 30 nm, or about 15 to 30 nm, or about 20 to 30 nm, or about 25 to 30 nm, e.g. about 1, about 5, about 10, about 15, about 20, about 25, or about 30 nm.

Examples for metalloids may include Boron, Silicon, Germanium, Arsenic, Antimony, Tellurium and Polonium. It may additionally or alternatively be selected from the group consisting of group 14 elements. Examples for group 14 elements include Silicon, Germanium, Tin or Lead. The metalloid may be Germanium. Preferably the metalloid may be selected for its high visible light transparency. The metalloid layer may have a thickness in the range of about 0.1 to 2.0 nm, or about 0.5 to 2.0, or about 1.0 to 2.0, or about 1.5 to 2.0, or about 0.1 to 1.5, or about 0.1 to 1.0, or about 0.1 to 1.5, or about 0.1 to 1.0, or about 0.1 to 0.5 nm, e.g. about 0.1 nm, or about 0.5 nm, or about 1.0 nm, or about 1.5 nm, or about 2.0 nm.

The oxide layer may exhibit no electrical conductivity. As such, the oxide may be selected from the group consisting of $SiO_2$, $TiO_2$, $B_2O_3$, $Na_2O$, $K_2O$, $Al_2O_3$ and $P_2O_3$. The oxide layer may have the function of insulation. It may be a passivation layer against oxygen. Preferably is shows a high thermal stability. As such, the oxide may be $SiO_2$. Silicon dioxide may have the additional advantage of being widely available and non-toxic.

The transition metal and metalloid layers are between the oxide layers. In this way the oxide layers can insulate the metal and metalloid layers from the coated substrate and the surface. Other layers can be inserted between the oxide layer and the substrate, between the oxide layer and the metal or metalloid layers or between the oxide layer and the surface. Preferably the inner oxide layer is deposited on the coated substrate. Preferably a metalloid layer or metal is directly on top of the inner oxide layer. Preferably the outer oxide layer is directly on top of a metalloid or metal layer. Optionally on the outer oxide layer a functional layer can be added.

The oxide layer may have a thickness in the range of about 10 to 200 nm, or about 30 to 200 nm, or about 50 to 200 nm, or about 70 to 200 nm, or about 100 to 200 nm, or about 130 to 200 nm, or about 150 to 200 nm, or about 180 to 200 nm, or about 10 to 180 nm, or about 10 to 150 nm, or about 10 to 130 nm, or about 10 to 100 nm, or about 10 to 80 nm, or about 10 to 50 nm, or about 10 to 30 nm, e.g. about 10 nm, or about 30 nm, or about 50 nm, or about 80 nm, or about 100 nm, or about 130 nm, or about 150 nm, or about 180 nm, or about 200 nm.

The following layer structure is preferred: substrate/oxide layer/metal and metalloid layers/oxide layer/functional layer (optional). Most preferred is a five layer structure (or optional six layer structure with functional layer) consisting of substrate/oxide layer/metalloid layer/metal layer/metalloid layer/oxide layer/functional layer (optional). The functional layer may be a self-cleaning layer.

The transition metal layer may be in the centre of the plurality of layers. It may have an equal number of layers on either sides of it. It may have an approximately equal amount of material (in weight) on either sides of it. It may have the exact same type of layers on either sides of it.

A first layer of metalloid may be positioned on top of the transition metal layer and a second layer of metalloid may be positioned at the bottom of the transition metal layer. A first layer of oxide may be positioned on top of the outer metalloid layer and a second layer of oxide may be positioned at the bottom of the inner metalloid layer of the coating.

The coating may exhibit at least two axis of symmetry. The transition metal layer may be a mirror plane within the coating. The multilayer structure may not be symmetrical with regard to thickness.

The coating may consist of five to six layers. Where it consists of five layers, the transition metal layer may be in the middle. There may be one or two metalloid layers. There may be two oxide layers.

Advantageously, the plurality of layers does not contain a transparent conductive oxide layer, such as an indium tin oxide (ITO) layer, or any other transparent conductive film. Avoiding ITO as a multilayer material is not only more cost-effective, it further avoids issues of instability of the transparent conductive oxide with the transition metal layer, especially Silver layers, under the environmentally caused influences.

Advantageously, the plurality of layers does also not contain any other transparent conductive oxides (TCOs). Avoiding TCOs as multilayer material results in higher environmental stability of the multilayer coating.

The plurality of layers may consist exclusively of inorganic matter. It may not contain graphene or any carbon-containing functional groups. It may not contain, for example, nitrides, cyanides, ketones, esters or amides.

The thickness ratio of the metalloid to the transition metal may be in the range of about 1:5 to 1:20, or about 1:5 to 1:17, or about 1:5 to 1:14, or about 1:5 to 1:12, or about 1:5 to 1:9, or about 1:5 to 1:7, or about 1:7 to 1:20, or about 1:9 to 1:20, or about 1:12 to 1:20, or about 1:14 to 1:20, or about 1:17 to 1:20, e.g. about 1:5, or 1:7, or 1:9, or 1:12, or 1:14, or 1:17, or about 1:20. The thickness ratio of the transition metal to the oxide may be in the range of about 1:6 to 1:60, or about 1:6 to 1:50, or about 1:6 to 1:40, or about 1:6 to 1:30, or about 1:6 to 1:20, or about 1:6 to 1:10, or about 1:10 to 1:60, or about 1:20 to 1:60, or about 1:30 to 1:60, or about 1:40 to 1:60, or about 1:50 to 1:60, e.g. about 1:6, or about 1:10, or about 1:20, or about 1:30, or about 1:40, or about 1:50, or about 1:60.

The multilayer coating may be thinner than about 300 nm, preferably thinner than about 200 nm. Optionally, it may be thinner than about 180 nm, about 160 nm, about 140 nm, about 120 nm, about 100 nm, about 80 nm, about 60 nm, or about 40 nm.

The multilayer coating may have a thickness in the range of about 50 to 500 nm, or about 50 to 300 nm, or about 50 to 250 nm, or about 50 to 200 nm, or about 50 to 150 nm, or about 50 to 100 nm, or about 100 to 300 nm, or about 150 to 300 nm, or about 200 to 300 nm, or about 250 to 300 nm, or about 100 to 250 nm, or about 150 to 200 nm, e.g. about 50 nm, or about 100 nm, or about 150 nm, or about 200 nm, or about 250 nm, or about 300 nm. Alternatively, it may have a thickness in the range of about 40 nm to about 200 nm, about 60 nm to about 200 nm, about 80 nm to about 200 nm, about 100 nm to about 200 nm, about 120 nm to about 200 nm, about 140 nm to about 200 nm, about 160 nm to about 200 nm, about 180 nm to about 200 nm, about 40 nm to about 180 nm, about 40 nm to about 160 nm, about 40 nm to about 140 nm, about 40 nm to about 120 nm, about 40 nm to about 100 nm, about 40 nm to about 80 nm, or about 40 nm to about 60 nm.

The multilayer coating may consist entirely of solids. The coating may be a dry film. It may therefore comprise less than about 1% liquid (in total) by weight or less than about 0.9, 0.8, 0.7, 0.6, 0.5, 0.4, 0.3, 0.2, or 0.1% liquid by weight.

It has surprisingly been found that the multilayer coating used in the present invention exhibits good absorption properties in the UV range, good transmission properties in the visible range and rejection properties in the infra-red or near infra-red region. The transmission of UV radiation may be at least 90% blocked by a thickness of about 80 nm of said multilayer.

The multilayer coating may transmit at least 60% of visible light in the range of 500 nm to 700 nm through a thickness of about 80 nm of said multilayer.

The multilayer coating may have a transparency of SWIR radiation of less than 30% at a thickness of about 80 nm of said multilayer. There is provided an article comprising; a) a substrate; and b) a multilayer coating as described in the first aspect of the invention in the form of a multilayer on a surface of said substrate.

The multilayer coating of the article may have a thickness in the range of about 50 to 500 nm, or about 50 to 300, or about 50 to 250 nm, or about 50 to 200 nm, or about 50 to 150 nm, or about 50 to 100 nm, or about 100 to 300 nm, or about 150 to 300 nm, or about 200 to 300 nm, or about 250 to 300 nm, or about 100 to 250 nm, or about 150 to 200 nm, e.g. about 50 nm, or about 100 nm, or about 150 nm, or about 200 nm, or about 250 nm, or about 300 nm. The substrate for the coating may be selected from materials in the group consisting of polymer, glass, wood, silicon, metal, metal alloy and any mixture thereof.

The substrate may preferably be glass.

Additionally or alternatively, the substrate may be a polymer or a polymer mixture. The polymer or polymer mixture may serve as a vehicle or a carrier for the multilayer coating. Therefore the polymer may be a film-forming polymer. It may be for example a flexible polymer film or article. It may have a transition glass temperature below room temperature, or below the intended use temperature, e.g. below about 20, 15, 10, 5 or 0° C.

The polymer may be selected from the group such as polycarbonate, polyethylene terephthalate (PET), acrylonitrile butadiene styrene (ABS), poly(methyl methacrylate) (PMMA), poly(vinylacetat) (PVAc) or high impact polystyrene (HIPS).

In a second aspect of the invention, there is provided an article comprising a) a substrate; and b) a multilayer coating as disclosed above in the form of a multilayer coating on a surface of said substrate.

The multilayer coating is preferably deposited on the surface of the substrate of the article. If the article is a window or transparent sheet, the coating can be applied on the inner and outer side sides of the article, e.g. the screen. Preferably it is only applied on one side of the window or sheet. The inner side (not exposed to the outside environment) can be mentioned as especially preferred.

The article may further comprise a functional layer. As such functional layers there can be mentioned self-cleaning layers, layers with a lotus effect, layers that contain catalysts that oxidize pollutants, hard coating layers etc.

In one embodiment a self-cleaning layer may be bonded to the multilayer whereby the multilayer coating is disposed between the substrate and the self-cleaning layer on the outer surface. The self-cleaning layer may comprise a hydrophilic self-cleaning material. The self-cleaning layer may comprise titanium dioxide. In another embodiment a hard coating layer may be bonded to the multilayer whereby the multilayer coating is disposed between the substrate and the hard coating layer on the outer surface. The hard coating layer may comprise aluminium oxide, zirconium oxide or mixtures thereof.

The article comprising the multilayer may be substantially non-toxic, such as titanium dioxide, or may have no toxic extractable.

Within the article, the adhesive strength between the substrate and the multilayer coating may be greater than the cohesive strength of the multilayer coating. Thus if sufficient force is applied, the multilayer coating may fail within the body of the coating rather than at the adhesive interface between the coating and the substrate. This ensures a suitable hold between the surface of the substrate and the multilayer coating. There may be no peel off observed under tape peel off testing. Advantageously, because the multilayer coating is a thin film of less than about 200 nm to 300 nm of materials, it does not add on much weight onto the substrate, keeping it as light weight as possible.

There is provided a process for making a multilayer coating as disclosed above, comprising depositing the layers using physical vapour deposition. Physical vapour deposition is a widely used deposition technique that can cover large areas with good uniformity. General methods used in glass coating, semiconductor and disk drive industry can be applied. Advantageously, the multilayer coatings can be made in conformity with existing commercial technology that can yield high uniformity and high-throughput. Therefore, in the manufacturability of the inventive multilayer coatings, high setup cost is not a hurdle, which means that it has an extremely low barrier for its utilization unlike many potential and existing alternatives.

Advantageously, the depositing in the above process occurs at room temperature using physical vapour deposition. The plurality of layers is deposited in a vacuum chamber having a base pressure which is a reduced pressure of at least below $1\times10^{-6}$ Torr, or at least about $5\times10^{-6}$ Torr, or at least about $1\times10^{-5}$ Torr, or at least about $5\times10^{-5}$ Torr, or at least about $1\times10^{-4}$ Torr, or at least about $5\times10^{-4}$ Torr, or at least about $1\times10^{-3}$ Torr. The base pressure is adjusted, using a pump, to be as low as possible. If necessary, Argon and Oxygen are added in to set the pressure.

There is provided a process for making an article as disclosed above comprising the step of applying a multilayer as disclosed above to the surface of a substrate. The multilayer may be deposited sequentially one after another until the final plurality of layers is fabricated. Care may be taken that during the deposition of the transition metal layer(s) and the metalloid layer(s), Oxygen is not introduced as other oxide layers may form rather than the metallic film.

The process may further comprise the step of additionally depositing a self-cleaning layer on top of the article after applying the multilayer coating.

The process may be applicable to large scale production of the multilayer coating. It may be applicable to conventional present window shields fabrication processes. It may be applicable for the fabrication of windows, window shields or plastic sheets. The application size may depend on the size of the target being used. For example, in the real glass coating manufacturing industry, the size of the glass panels can be up to 3 m×6 m (eg. Leybold Optics system).

There is provided a multilayer made by the process as disclosed above.

There is provided an article made by the process as disclosed above.

There is provided for use of a multilayer coating for reducing exposure of a medium to infra-red radiation, said multilayer being disposed on said substrate.

There is provided for use of an article as disclosed above for reducing exposure of a medium to infra-red radiation.

There is provided for use of a multilayer as disclosed above in windows, windshields, or building materials.

BRIEF DESCRIPTION OF DRAWINGS

The accompanying drawings illustrate a disclosed embodiment and serve to explain the principles of the disclosed embodiment. It is to be understood, however, that the drawings are designed for purposes of illustration only, and not as a definition of the limits of the invention.

EXAMPLES

Non-limiting examples of the invention and a comparative example will be further described in greater detail by reference to specific Examples, which should not be construed as in any way limiting the scope of the invention.

Figure 1:
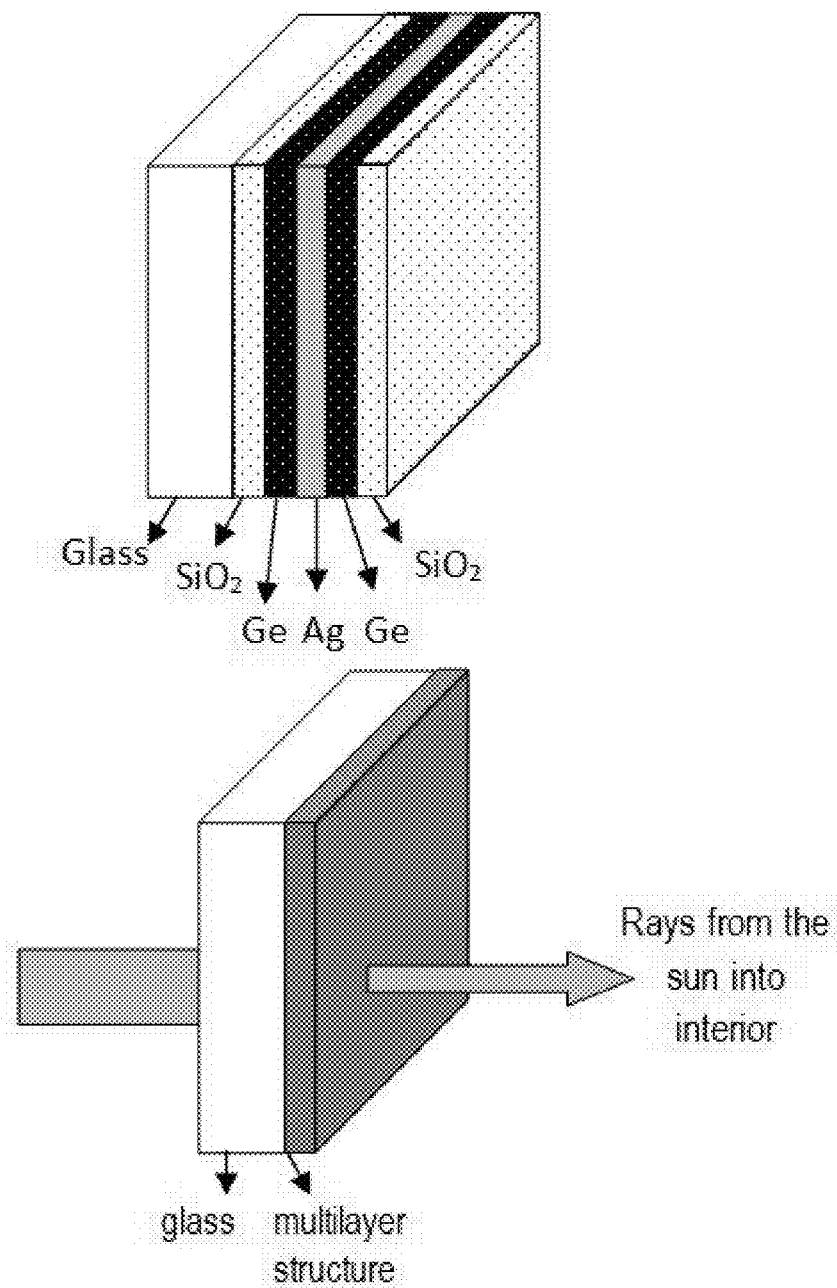
FIG. 1 is a schematic diagram of a $SiO_2$/Ge/Ag/Ge/$SiO_2$/glass substrate structure.

A multilayer coating as disclosed above has been exemplified in FIG. 1. FIG. 1 shows a schematic diagram of a substrate, having a multilayer coating of five layers deposited thereon. The substrate is glass. The multilayer has the following layer structure: $SiO_2$/Ge/Ag/Ge/$SiO_2$. Heat rejection is shown as sunlight, which is projected towards the article as disclosed above, comprising the substrate with the multilayer coating. The heat radiation of the sunlight is sufficiently reduced.

Figure 2:
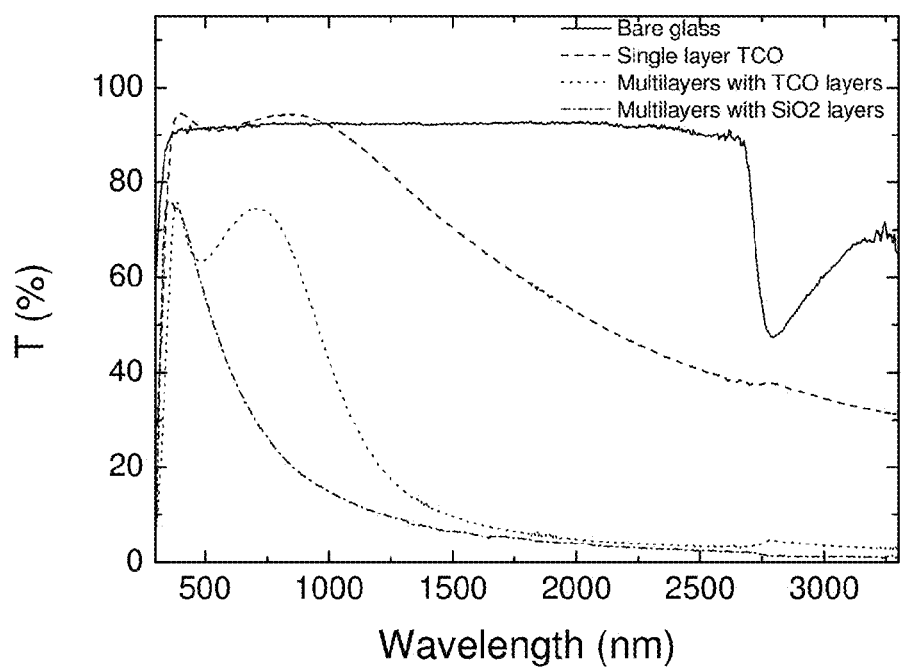
FIG. 2 shows the optical transparencies of the glass substrate, single layer TCO oxide, multilayers with TCO layers and multilayers with $SiO_2$ layers.

In this disclosure, there is demonstrated that using an insulating, widely available and high thermal stability material such as silicon dioxide, a good performance in terms of high transparency in the visible region, high infrared rejection and UV filtering as shown in FIG. 2 can be obtained.

These silicon dioxide layers function as a perfect passivation layer against Oxygen to protect the critical Silver heat rejection layer. FIG. 2 further shows the optical transparency of the glass substrate, single layer TCO oxide, multilayers using TCO and multilayers using silicon dioxide. As such, the produced multilayer coatings represent an improvement over previously used TCO containing multilayer coatings.

The exemplified structure has only five layers to achieve the desirable improvement in optical property. These five layers are all fabricated based on physical vapour deposition techniques which comprise only three different materials. If necessary, an additional $TiO_2$ layer ($6^{th}$ layer) can be added to enhance the functionality of the multilayer coating.

This multilayer coating can control the heat reflecting property of the film while maintaining high visible transparency due to the additional Germanium layer.

Due to adhesion problem between materials, some thin films have difficulty to retain good adhesion on particular substrate. Peeling effect may occur, hence affect the intended performance of the overall structure. However, the multilayer thin coating including a $TiO_2$ layer according to this embodiment has been deposited on glass and plastic at room temperature. A simple tape test has been done and it has been found that the multilayer coating adheres well and does not crack easily.

Silicon dioxide used as the oxide layer in the embodiment is a material derived from sand. The most common silicon dioxide encountered is glass. Titanium dioxide as used is an ingredient in many cosmetics. Silver has been a well-known wearable accessory material for many years. Recently, Germanium has also been a popular material in bio-magnetic bracelet. All the components of the embodiment are advancing the development of disposable construction materials, automobile and consumer care electronics that require selective transparency in VIS-NIR region. The inventive coating is able to absorb UV and reject SWIR rays. This means that it can reduce the photo-degradation damage on materials.

Silicon used in the embodiment is the most abundant electropositive element in the Earth's crust. Sand is an example of silicon dioxide which is used as source of the silicon produced commercially. In the proposed invention, only tens of nm of this silicon dioxide is used. Moreover, by deposition of a few nm of Silver and Germanium, selective transparency in the NIR wavelength is obtained.

In the exemplified embodiment, other than the weight of the substrate, the multilayers are thin films of less than 200 nm of materials. Therefore, they do not add on much weight onto the substrate, keeping it as light weight as possible.

All the films in the invention have been deposited at room temperature which means there is no need to heat up any substrate. This further means less time is used during deposition process as it does not need to ramp up or ramp down or hold the temperature during growth. This also means that the proposed structure can be deposited even onto flexible polymer substrates.

Physical vapour deposition as used is a widely applicable deposition technique that can cover large areas with a coating of good uniformity. It has been used in glass coating, semiconductor and disk drive industry for many years. This represents excellent conformity with existing commercial technology that can yield high uniformity and high-throughput. Therefore, with regard to the manufacturability, high setup cost is not a hurdle for this invention which means that it has an extremely low barrier for its utilization unlike many alternatives.

In addition, silicon dioxide is a very low cost material and in the exemplified embodiment, only a thin layer of this low cost material is needed.

Example 1

Depositing a Multilayer Coating

The material sources for the transition metal layer(s) and metalloid layer(s) were used in their purest form and the oxide layers were produced by an oxide source with a purity of at least 99.99%.

A vacuum chamber made of stainless steel by Korea Vacuum Technology was evacuated using a Leybold turbomolecular pump and an Edwards rotary pump. The substrate holder was cooled by a closed circulation chiller to maintain the substrate and substrate holder at a temperature of about 25° C. during deposition. The base pressure was reduced to at least $1\times10^{-6}$ Torr. A 10 cm×10 cm glass substrate was pre-washed with acetone and isopropanol 10 min each before blow-drying with compressed air. Then, it was loaded into the vacuum chamber and the pressure was reduced until reaching the base pressure of at least $1\times10^{-6}$ Torr. The deposition of a silicon dioxide layer was achieved by using a ceramic $SiO_2$ target at a precise oxygen pressure of $1\times10^{-4}$ Torr at room temperature, whereby the deposited layer was transparent. This was followed by deposition of a thin Germanium layer at a rate of 0.1 nm/s, then by deposition of a Silver layer at a rate of ~1 nm/s and then by deposition of another layer of thin Germanium layer at a rate of 0.1 nm/s. The thicknesses of the Germanium and Silver layers were pre-calibrated using AFM and quartz crystal thickness monitor. Then, the rate of growth was calibrated. During the growth of the metalloid and transition metal layer, Oxygen was not introduced to prevent oxidation. Finally, this was followed by deposition of another layer of silicon dioxide at a precise Oxygen pressure of $1\times10^{-4}$ Torr at room temperature. Various thicknesses of similar materials were deposited at different times. For example, a 50 nm of $SiO_2$ was deposited first, followed by a 0.5 nm Germanium, then 7 nm of Silver, then 0.5 nm of Germanium and finally 50 nm $SiO_2$.

Polycarbonate substrates (10 cm×10 cm) were also deposited in the same manner and using the same parameters, but without acetone washing steps. The multilayers deposited were reasonably free of voids, cracks, pinholes or other defects.

Figure 3:
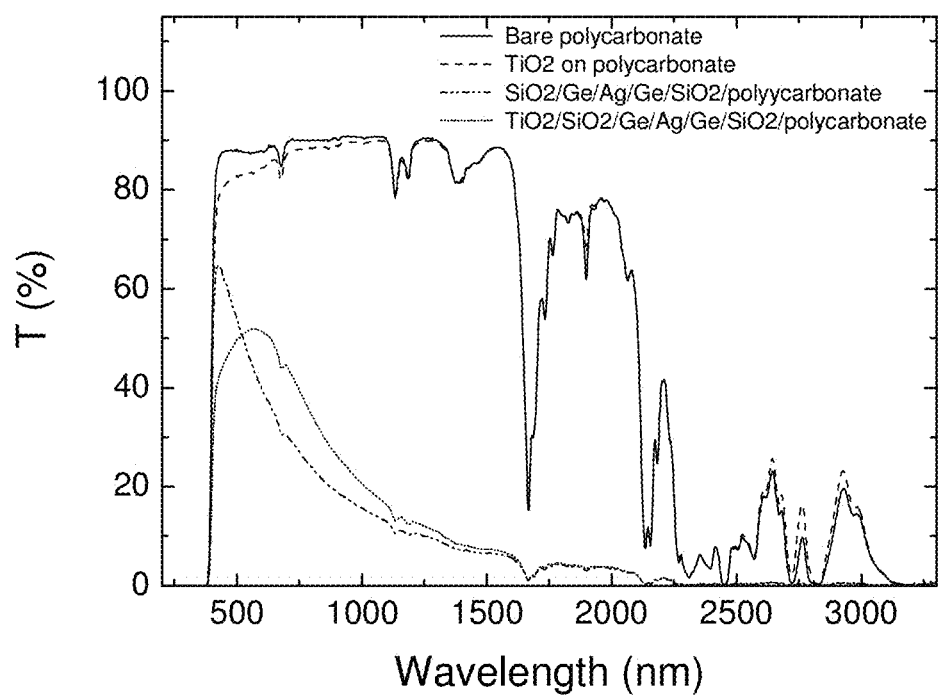
FIG. 3 shows the optical transparencies of a polycarbonate substrate, a single layer $TiO_2$ on polycarbonate, multilayers with silicon dioxide on polycarbonate and $TiO_2$ on multilayers with silicon dioxide on polycarbonate.

The transmission property of the multilayer samples were then measured by using a Shimadzu UV-VIS-NIR spectrophotometer of model UV-3600 and are shown in FIG. 2 and FIG. 3.

A simple tape peel-of test (using 3M polyimide 5413 tape) was done on the film shown that the film is adhesive on the glass substrate and polycarbonate substrate.

The process to produce the multilayer coating accordingly in general comprises the following steps:

a) Cleaning the substrates with acetone and isopropanol before blow-drying with compressed air.

b) Deposition of a silicon dioxide layer at a precise oxygen pressure of $1\times10^{-4}$ Torr at room temperature of about 20 to 25° C., whereby a transparent deposited layer is obtained.

c) Follow-up deposition of a thin Germanium layer, then by a Silver layer at a pressure below $1\times10^{-6}$ Torr and then another layer of thin Germanium layer while carefully calibrating the thickness of Germanium and Silver layers. The thicknesses of the Germanium and Silver layers are measured using AFM and quartz crystal thickness monitor. Various thicknesses of similar materials are deposited at different times. Then, the rate of growth is calibrated.

d) Finally, follow-up deposition of another layer of silicon dioxide at a precise Oxygen pressure of $1\times10^{-4}$ Torr at room temperature of about 20 to 25° C., whereby a transparent deposited layer is obtained.

A controlled deposition rate of 0.1 nm/s to 5 nm/s during the steps is desirable to ensure good quality film growth.

Other than deposition on glass substrate, the room temperature deposited proposed multilayers have also been deposited on plastic (polycarbonate, PET, PMMA) as exemplified for polycarbonate in FIG. 3. The performance of the proposed multilayers on plastic has been found to be similar to deposition on glass. To enhance the functionality of the proposed multilayers, a layer of Titanium dioxide ($TiO_2$) is also deposited. One line represents a $TiO_2$ layer on bare polycarbonate which does not have any infrared rejection effect by itself. However, by depositing $TiO_2$ on the proposed multilayer (the second lowest line), the proposed multilayer have additional functionality of having self-cleaning property while inheriting the high infrared rejection, high visible transparency and UV filtering.

INDUSTRIAL APPLICABILITY

The multilayer coatings described in this disclosure may be useful as a facile and low-cost alternative to conventional window shields and window coatings. The good UV absorbing properties, visible light transparency and high infra-red light rejection of the ensuing substrates makes them very useful for all building material applications, since they reduce costs for electricity and air-conditioning.

It will be apparent that various other modifications and adaptations of the invention will be apparent to the person skilled in the art after reading the foregoing disclosure without departing from the spirit and scope of the invention and it is intended that all such modifications and adaptations come within the scope of the appended claims.

What is claimed is:

1. A multilayer heat rejection coating comprising a plurality of layers comprising:
   one or more layers of elemental silver;
   layers of elemental germanium; and
   two or more layers of silicon dioxide ($SiO_2$);
   wherein the silver and germanium layers are between the $SiO_2$ layers,
   wherein a first layer of germanium is positioned on top of the silver layer and a second layer of germanium is positioned at the bottom of the silver layer,
   wherein a first layer of $SiO_2$ is positioned on top of the outer germanium layer and a second $SiO_2$ layer is positioned at the bottom of the inner germanium layer of the coating, and wherein the plurality of layers does not contain a transparent conductive oxide.

2. The multilayer coating of claim 1, comprising a multilayer consisting of $SiO_2$/Germanium/Silver/Germanium/$SiO_2$.

3. The multilayer coating of claim 1, wherein the coating consists of five to six layers.

4. An article comprising:
a substrate; and
a multilayer coating of claim 1 in the form of a multilayer on a surface of said substrate.

5. The article of claim 4, wherein the multilayer coating has a thickness in the range of 50 nm to 300 nm.

6. The article of claim 4, wherein the substrate is selected from materials in the group consisting of polymer, glass, wood, silicon, metal, metal alloy, and any mixture thereof.

7. The article of claim 4, further comprising a functional layer deposited on the multilayer coating.

8. The article of claim 7, wherein the functional layer is a self-cleaning layer comprising titanium dioxide.

9. The multilayer coating according to claim 1 for use as a coating for windows, windshields, plastic sheets, or building materials.

10. A process for making a multilayer coating of claim 1, comprising depositing the layers using physical vapour deposition.

* * * * *